(12) United States Patent
Suzuki et al.

(10) Patent No.: US 7,656,449 B2
(45) Date of Patent: *Feb. 2, 2010

(54) SOLID-STATE IMAGING APPARATUS HAVING GATE POTENTIAL THAT IS NEGTIVE WITH RESPECT TO A WELL REGION

(75) Inventors: Ryoji Suzuki, Kanagawa (JP); Takahisa Ueno, Kanagawa (JP); Keiji Mabuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 336 days.

This patent is subject to a terminal disclaimer.

(21) Appl. No.: 11/728,140

(22) Filed: Mar. 23, 2007

(65) Prior Publication Data

US 2007/0177041 A1    Aug. 2, 2007

Related U.S. Application Data

(63) Continuation of application No. 10/286,313, filed on Nov. 1, 2002, now Pat. No. 7,209,171.

(30) Foreign Application Priority Data

Nov. 6, 2001    (JP) ............................. 2001-340440

(51) Int. Cl.
*H04N 3/14*    (2006.01)
*H04N 9/64*    (2006.01)
*H01L 27/148*    (2006.01)
*H01L 31/062*    (2006.01)

(52) U.S. Cl. .................... 348/308; 348/248; 250/208.1; 257/230; 257/291

(58) Field of Classification Search ................. 348/308, 348/248, 241, 254, 281, 296, 302, 304; 250/208.1; 257/223, 225, 229, 230, 231, 239, 292, 291, 257/258

See application file for complete search history.

(56) References Cited

U.S. PATENT DOCUMENTS 5,471,245 A    11/1995   Cooper et al.

(Continued)

FOREIGN PATENT DOCUMENTS

JP    2001-024952    1/2001

(Continued)

OTHER PUBLICATIONS

Mabuchi et al., "CMOS Image Sensors Comprised of Floating Diffusion Driving Pixels with Buried Photodiode", Dec. 2004; IEEE Journal of Solid-State Circuits; vol. 39, No. 12, pp. 2408-2416.

*Primary Examiner*—John M Villecco
(74) *Attorney, Agent, or Firm*—Robert J. Depke; Rockey, Depke & Lyons, LLC

(57) ABSTRACT

Each unit pixel includes a photodiode, a reading selection transistor, a reading transistor, an amplifying transistor, a reset transistor, and a horizontal selection transistor, and thus a MOS image sensor of a dot-sequential reading 5-Tr type is formed. The reading selection transistor and the reading transistor are formed with a two-layer gate structure, and gate potential of the reading selection transistor and the reading transistor is set to a negative potential. Thereby, a lower layer of a gate region of the reading transistor and the reading selection transistor is controlled to a negative potential. Thus, depletion in the lower layer region is suppressed to reduce leakage current.

19 Claims, 10 Drawing Sheets

U.S. PATENT DOCUMENTS

| | | |
|---|---|---|
| 6,037,577 A | 3/2000 | Tanaka et al. |
| 6,566,697 B1 | 5/2003 | Fox et al. |
| 6,731,337 B2 | 5/2004 | Watanabe |
| 6,798,451 B1 | 9/2004 | Suzuki et al. |
| 6,822,306 B2 | 11/2004 | Mabuchi |
| 6,975,357 B1 | 12/2005 | Suzuki et al. |
| 7,045,400 B2 | 5/2006 | Mabuchi |
| 7,068,315 B1 | 6/2006 | Suzuki et al. |
| 2003/0227039 A1* | 12/2003 | Umeda et al. ............... 257/291 |
| 2005/0036051 A1 | 2/2005 | Ueno et al. |
| 2005/0062068 A1 | 3/2005 | Mabuchi |
| 2006/0082667 A1* | 4/2006 | Rhodes ....................... 348/308 |

FOREIGN PATENT DOCUMENTS

| | | |
|---|---|---|
| JP | 2003-134399 | 5/2003 |

* cited by examiner

SOLID-STATE IMAGING APPARATUS HAVING GATE POTENTIAL THAT IS NEGTIVE WITH RESPECT TO A WELL REGION

The subject matter of application Ser. No. 10/286,313, is incorporated herein by reference. The present application is a continuation of U.S. Ser. No. 10/286,313, filed Nov. 1, 2002, now U.S. Pat. No. 7,209,171 which claims priority to Japanese Patent Application Japanese Patent Application No. JP 2001-340440 filed Nov. 6, 2001. The present application claims priority to these previously filed applications.

BACKGROUND OF THE INVENTION

The present invention relates to a solid-state imaging apparatus having a plurality of photoelectric converting elements each forming an imaging pixel and having a structure for reading a signal charge accumulated in each of the photoelectric converting elements on a dot-sequential basis using a plurality of transistors, and a driving method of the solid-state imaging apparatus.

Conventionally proposed as a solid-state imaging apparatus of this type is an X-Y addressing type image sensor that is provided for each unit pixel with a photodiode for photoelectric conversion and a total of five MOS transistors: a gate for reading a signal charge accumulated in the photodiode; a reading selection gate; an amplifying gate; a reset gate; and a horizontal selection gate, and which is capable of reading the signal charge in each unit pixel on a dot-sequential basis (see Japanese Patent Laid-Open No. 2001-24952 and Japanese Patent Laid-Open No. 2001-24946, for example).

Specifically, in the image sensor, a signal charge corresponding to an amount of light received by the photodiode is read by the reading transistor and transferred to an FD (floating diffusion) part connected to a gate of the amplifying transistor. The signal charge is amplified by the amplifying transistor and thus converted into a current signal corresponding to potential of the FD.

Then, the output of the amplifying transistor is outputted by the horizontal selection transistor in predetermined timing, and sent to a signal processing circuit provided outside the imaging area.

Operation of the reading transistor is selectively controlled by the reading selection transistor, whereby a pixel from which to read a signal charge is selected.

The reset transistor resets the signal charge of the FD to a power supply level.

An image sensor having a pixel structure formed by five such transistors will be referred to as a solid-state imaging apparatus of a dot-sequential reading 5-Tr type.

However, in the related-art solid-state imaging apparatus as described above, when depletion occurs in a lower layer of a gate region of the reading transistor for transferring the signal charge to the FD, leakage current is correspondingly increased and grain-like noise occurs on the screen.

SUMMARY OF THE INVENTION

The present invention has been made in view of the above, and it is accordingly an object of the present invention to suppress depletion in the lower layer of the gate region of the reading transistor, reduce the leakage, and thereby provide a solid-state imaging apparatus with reduced noise and a driving method thereof.

According to an aspect of the present invention, there is provided a solid-state imaging apparatus comprising: a plurality of unit pixels arranged in a vertical direction and a horizontal direction in a two-dimensional matrix form; and, within the unit pixels, photoelectric converting means for accumulating a signal charge according to an amount of light received; a floating diffusion portion for extracting the signal charge obtained by the photoelectric converting means; an amplifying transistor for extracting a potential variation by the signal charge of the floating diffusion portion; a reading transistor for transferring the signal charge accumulated by the photoelectric converting means to the floating diffusion portion on the basis of a line selection signal; and a reading selection transistor for controlling the reading transistor on the basis of a pixel selection signal; wherein gate potential of at least one of the reading transistor and the reading selection transistor which is on a side of the photoelectric converting means is set to a negative potential with respect to a well region.

Furthermore, according to another aspect of the present invention, there is provided a driving method of a solid-state imaging apparatus, the solid-state imaging apparatus including: a plurality of unit pixels arranged in a vertical direction and a horizontal direction in a two-dimensional matrix form; and, within the unit pixels, photoelectric converting means for accumulating a signal charge according to an amount of light received; a floating diffusion portion for extracting the signal charge obtained by the photoelectric converting means; an amplifying transistor for extracting a potential variation by the signal charge of the floating diffusion portion; a reading transistor for transferring the signal charge accumulated by the photoelectric converting means to the floating diffusion portion on the basis of a line selection signal; and a reading selection transistor for controlling the reading transistor on the basis of a pixel selection signal; wherein gate electrodes of the reading transistor and the reading selection transistor are formed by using two electrode layers different from each other, gate potential of at least the transistor on a side of the photoelectric converting means is set to a negative potential, and the gate electrode of the transistor on the side of the photoelectric converting means is controlled to the negative potential in at least a part of a non-selection period.

In the solid-state imaging apparatus according to the present invention, the gate electrodes of the reading transistor and the reading selection transistor provided in a unit pixel are formed by using two electrode layers different from each other, and the gate potential of at least the transistor on the photoelectric converting means side is set to a negative potential. Thus, a lower region (well region) of a gate region of the reading transistor is controlled to a negative potential. It is thereby possible to suppress depletion, reduce leakage current, and hence realize a solid-state imaging apparatus with reduced noise.

Also, in the driving method of a solid-state imaging apparatus according to the present invention, the gate electrodes of the reading transistor and the reading selection transistor are formed by using two electrode layers different from each other, and the gate potential of at least the transistor on the photoelectric converting means side is set to a negative potential. Thus, a lower region (well region) of the gate electrode of the reading transistor is controlled to a negative potential. It is thereby possible to suppress depletion in the lower region, reduce leakage current, and hence realize a solid-state imaging apparatus with reduced noise.

DETAILED DESCRIPTION OF THE PREFERRED EMBODIMENTS

Preferred embodiments of the present invention will next be described with reference to the drawings.

It is to be noted that while the embodiments to be described below are preferred concrete examples of the present invention and a variety of technically preferable limitations are set, the scope of the present invention is not limited to these modes in the description below unless there is a description that specifically limits the present invention.

Figure 1:
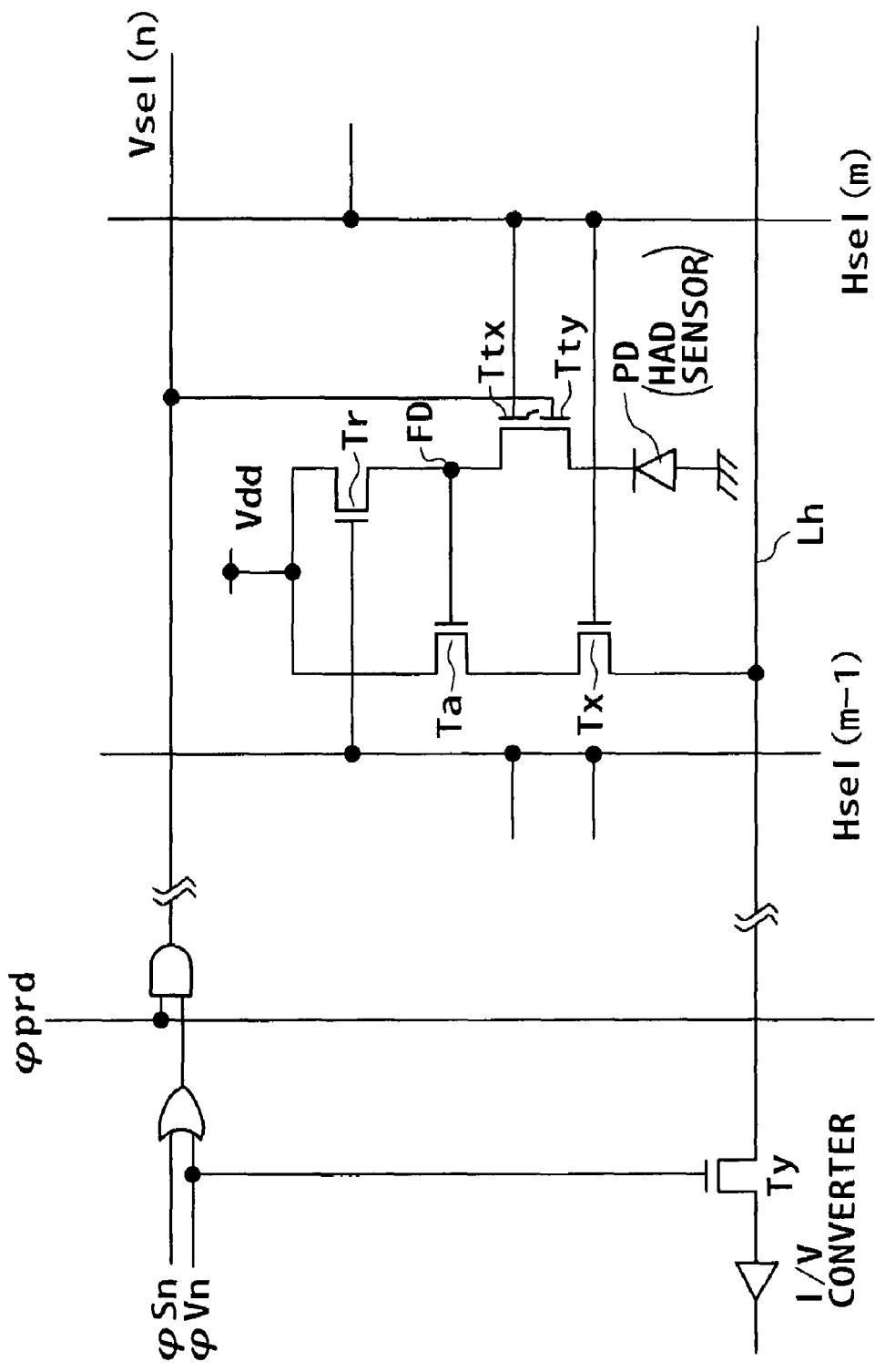
FIG. 1 is a circuit diagram showing a configuration of a unit pixel portion and its periphery in a MOS type solid-state imaging apparatus according to a first embodiment of the present invention.
Figure 2:
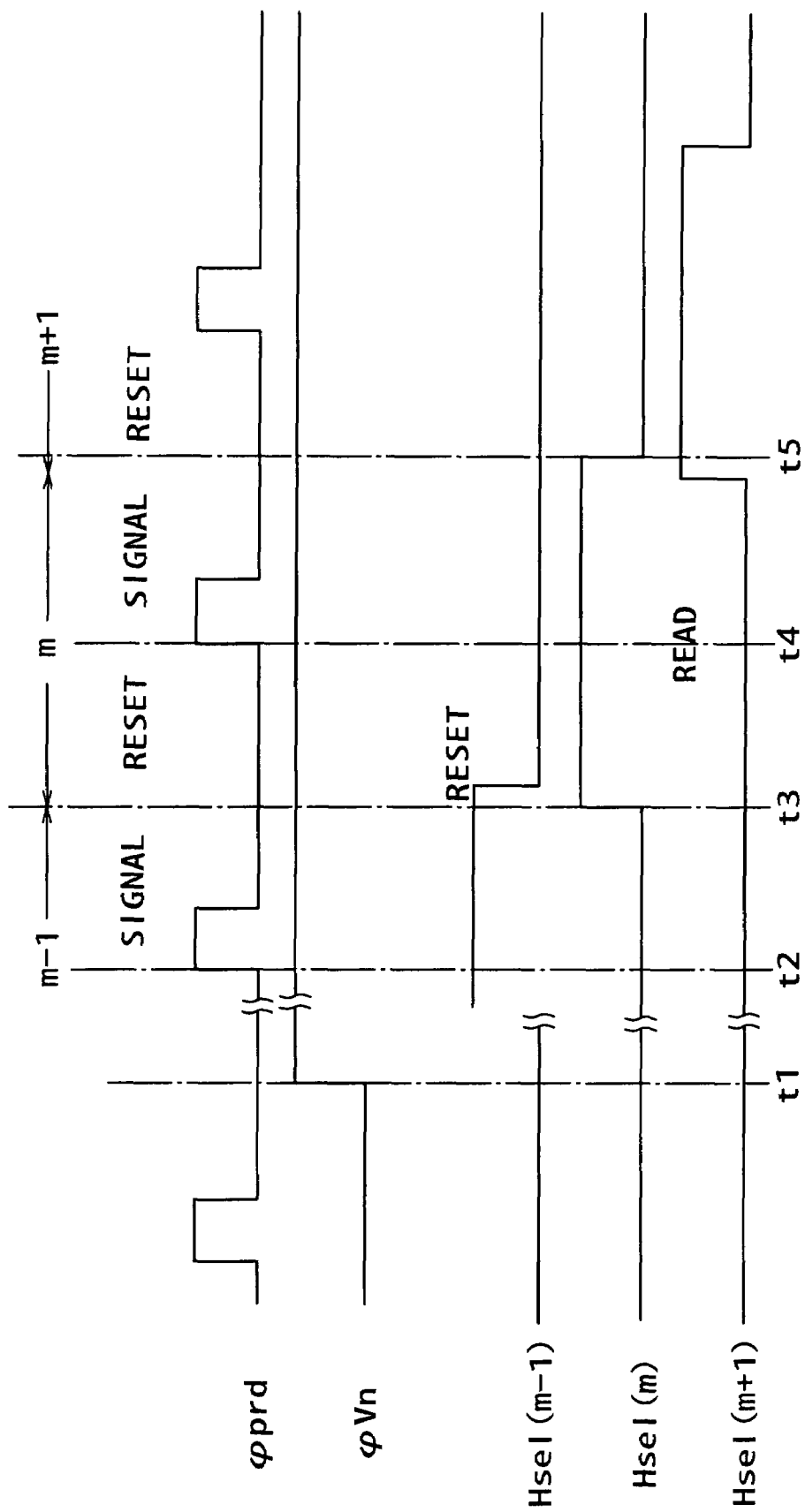
FIG. 2 is a timing chart of operation timing of transistors within the unit pixel portion shown in FIG. 1.

FIG. 1 is a circuit diagram showing a configuration of a unit pixel portion and its periphery in a MOS type solid-state imaging apparatus according to a first embodiment of the present invention. FIG. 2 is a timing chart of operation timing of transistors within the unit pixel portion shown in FIG. 1.

Figure 3:
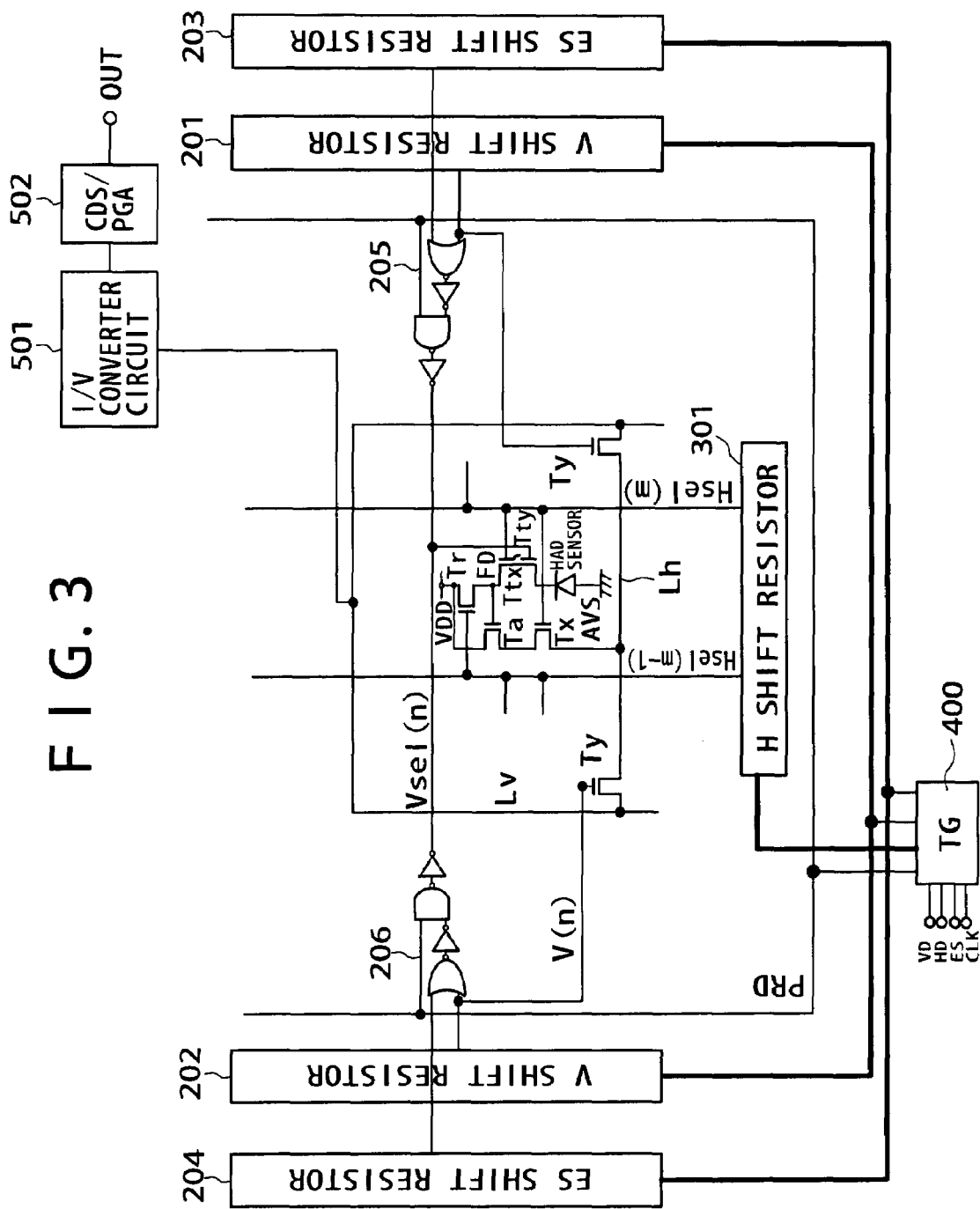
FIG. 3 is a block diagram schematically showing a configuration of the MOS type solid-state imaging apparatus provided with the unit pixel portion shown in FIG. 1.

FIG. 3 is a block diagram schematically showing a configuration of the MOS type solid-state imaging apparatus provided with the unit pixel portion shown in FIG. 1.

A general configuration of the MOS type solid-state imaging apparatus according to the present embodiment will first be described with reference to FIG. 1 and FIG. 3.

The MOS type solid-state imaging apparatus in the first embodiment is formed with a large number of unit pixel portions (only one unit pixel portion is shown in the figures) arranged in a vertical direction and a horizontal direction in a matrix form, a V (vertical) scanner and an H (horizontal) scanner for reading a pixel signal from each of the unit pixel portions on a dot-sequential basis, an ES scanner for performing electronic shutter (ES) selecting operation for each of the unit pixel portions, and the like.

Each of the unit pixel portions includes a photodiode PD serving as both photoelectric converting means and charge accumulating means, and a total of five MOS transistors: a reading transistor Tty for inputting a signal charge accumulated in the photodiode PD to an FD (floating diffusion) in a row unit; a reading selection transistor Ttx for selecting the reading transistor Tty in a pixel unit; an amplifying transistor Ta for amplifying the signal charge; a reset transistor Tr for resetting the FD; and a horizontal selection transistor Tx for selecting a pixel column. Thus, the unit pixel portions form a dot-sequential reading 5-Tr system that reads a signal charge in each unit pixel on the dot-sequential basis.

In this case, the reading selection transistor Ttx, the reading transistor Tty, and the reset transistor Tr are connected in series with each other in a channel direction between the photodiode PD and a power supply voltage VDD. The FD (floating diffusion) for transferring a signal charge is provided between a source of the reset transistor Tr and a drain of the reading selection transistor Ttx. The FD is connected to a gate of the amplifying transistor Ta.

The amplifying transistor Ta and the horizontal selection transistor Tx are connected in series with each other between VDD and a horizontal signal line Lh.

The reading transistor Tty and the reading selection transistor Ttx are formed adjacent to each other in the channel direction, and gate electrodes of the reading transistor Tty and the reading selection transistor Ttx are formed by using two electrode layers different from each other.

Figure 4:
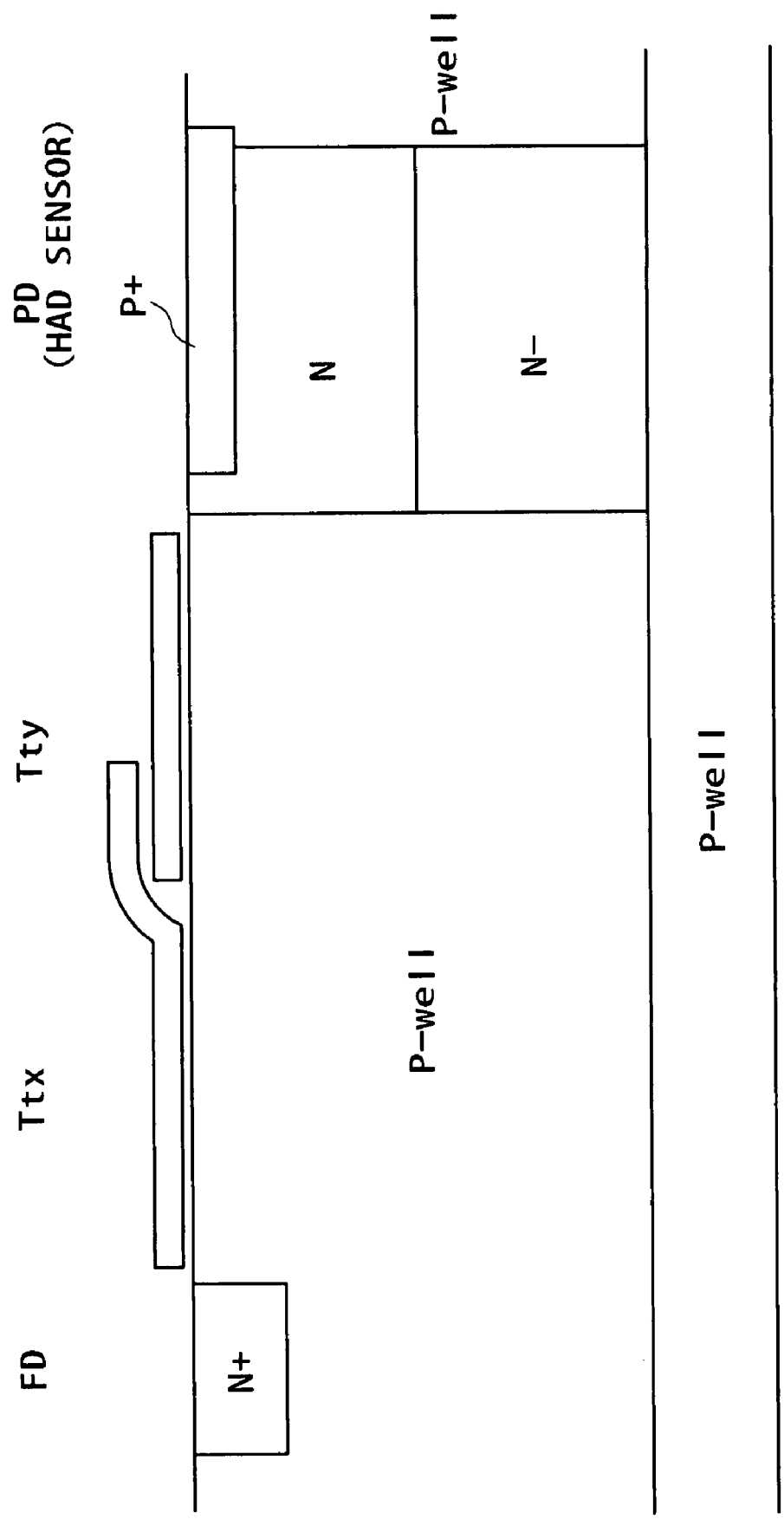
FIG. 4 is a schematic sectional view of a structure of the unit pixel portion shown in FIG. 1.

Specifically, as shown in FIG. 4, the upper electrode layer of the two electrode layers forms the gate electrode of the reading selection transistor Ttx, and the lower electrode layer forms the gate electrode of the reading transistor Tty. The upper gate electrode of the reading selection transistor Ttx is formed in a state of partly overlapping the lower gate electrode of the reading transistor Tty. The two gate electrodes are thus disposed without a diffused layer (a source or a drain) therebetween.

In the first embodiment, gate potential of the reading transistor Tty and the reading selection transistor Ttx is set to a negative potential for driving.

Thus, the two gate electrodes are provided for the reading transistor Tty and the reading selection transistor Ttx, and the gate potential of the reading transistor Tty and the reading selection transistor Ttx is set to a negative potential for driving to thereby control the lower layer of the gate region of the reading transistor Tty and the reading selection transistor Ttx to a negative potential. Thereby, depletion in the lower layer region is suppressed to thus reduce leakage current and consequently reduce noise.

In particular, leakage current that affects the PD part can be prevented by setting the gate potential of the reading transistor Tty on the PD side to a negative potential.

It is to be noted that while in the first embodiment, the gate potential of both the reading transistor Tty and the reading selection transistor Ttx is set to a negative potential, sufficient effect can be obtained by setting the gate potential of at least the reading transistor Tty on the PD side to a negative potential, and the gate potential of the reading selection transistor Ttx is set to a negative potential as a more desirable configuration.

Provided around the periphery of such a unit pixel portion are a vertical selection line Vsel arranged along a horizontal direction in the figure so as to correspond to each row of unit pixels and a horizontal selection line Hsel arranged along a vertical direction in the figure so as to correspond to each column of unit pixels.

In the first embodiment, a reset pulse for driving the reset transistor Tr, a horizontal selection pulse for driving the horizontal selection transistor Tx, and a reading selection pulse for driving the reading selection transistor Ttx are transmitted by horizontal selection lines Hsel.

More specifically, a horizontal selection line Hsel in an m-th column supplies the horizontal selection pulse to a gate of a horizontal selection transistor Tx in an m-th pixel column, supplies the reading selection pulse to a gate of a reading selection transistor Ttx in the m-th pixel column, and supplies the reset pulse to a gate of a reset transistor Tr in an (m+1)th pixel column.

In addition, a line selection pulse for driving the reading transistor Tty is transmitted by the vertical selection line Vsel. More specifically, a vertical selection line Vsel in an n-th row supplies a reading pulse to a gate of a reading transistor Tty in an n-th pixel row.

Thus, the first embodiment transmits the three signals, that is, the reset pulse, the horizontal selection pulse, and the reading selection pulse by the single horizontal selection line Hsel, whereby the number of wires arranged around the periphery of pixels is decreased and thus reduction in element size is realized without reducing light receiving area.

A pixel signal obtained by the above-described unit pixel is outputted from a source of the horizontal selection transistor Tx through the horizontal signal line Lh, then transmitted to a vertical signal line Lv by control of vertical selection transistors Ty provided to the right and left of the horizontal signal line Lh, as shown in FIG. 3, and transmitted to an I-V converter circuit 501 and a CDS/PGA circuit 502 provided outside the imaging area.

The I-V converter circuit 501 converts the current signal from each unit pixel into a voltage signal. The CDS/PGA circuit 502 removes noise such as reset noise from the image signal converted into the voltage signal by the I-V converter circuit 501 by a CDS (correlated double sampling circuit), and controls gain of the output signal by a PGA (programmable gain controller).

The vertical scanner (V scanner) and the electronic shutter scanner (ES scanner) are formed by V shift registers 201 and 202, ES shift registers 203 and 204, logical circuits 205 and 206, a driver (not shown) and the like. The vertical scanner and the electronic shutter scanner are started by a vertical synchronization start pulse, send a necessary pulse signal to the vertical selection transistor Ty for selecting the horizontal signal line Lh and the vertical selection line Vsel, and select a pixel row in synchronism with one horizontal synchronizing (one-H) period, for example.

The horizontal scanner (H scanner) is formed by an H shift register 301, a driver (not shown) and the like. The horizontal scanner is started by a horizontal synchronizing signal, sends necessary pulse signals to the horizontal selection line Hsel, and selects a pixel in synchronism with a bit synchronizing period, for example.

A timing generator (TG) 400 generates pulses for driving the circuits as described above.

Furthermore, in addition to the above circuits, the solid-state imaging apparatus in the first embodiment may have a driver circuit for sensor driving, an output amplifier for amplifying an output signal and the like, and further include circuits such as an auto gain controller (AGC), an analog-to-digital converter (ADC), a digital signal processor (DSP) and the like.

A driving method of the solid-state imaging apparatus in the first embodiment will be described in the following.

Basically, the driving method starts the solid-state imaging apparatus by a vertical synchronization start pulse, sequentially selects a line of each pixel row by the V scanner, sequentially selects unit pixels in each pixel row in a horizontal direction in bit synchronization by the H scanner, and reads a pixel signal using a reset pulse (XRST) and a reading pulse (PRD) transmitted in bit synchronization.

A pixel signal at the reset level and a pixel signal at the reading level are compared with each other, whereby a differential level between the pixel signals is outputted as an image signal.

At the time of shutter operation, similar operation is performed with the vertical selection transistors Ty turned off. Hence, pixel signals are not outputted to the vertical signal line Lv side and are discarded, whereby the shutter operation is performed.

Details of such pixel operation will be described in the following with reference to FIG. 2.

In first timing t1 in FIG. 2, a vertical selection pulse $\phi$Vn is applied to the vertical selection line Vsel in the n-th row to select the line in the n-th row as a specific line (row), and turns on the vertical selection transistor Ty.

In next timing t2, a horizontal selection pulse is turned on in a horizontal selection line Hsel (m−1) at an (m−1)th pixel, and a reading pulse $\phi$prd is turned on in this period, whereby the pixel at the n-th row and (m−1)th column is read.

In next timing t3, a horizontal selection pulse is turned on in the horizontal selection line Hsel (m) at the m-th pixel, whereby the horizontal selection transistor Tx and the reading selection transistor Ttx in the m-th pixel are turned on. Then, the horizontal selection pulse is turned off in the horizontal selection line Hsel (m−1) at the (m−1)th pixel, and a reset transistor Tr in the (m−1)th pixel is turned off, whereby reset operation is performed.

Thus, the horizontal selection transistor Tx in the m-th pixel is turned on while the reset transistor Tr in the (m−1)th pixel is turned on, and then the reset operation is performed, whereby FD potential can be stabilized. That is, if the FD is reset in a state in which the horizontal selection transistor Tx is turned off, when the horizontal selection transistor Tx is turned on next, a variation in source potential of the amplifying transistor Ta shifts the FD potential to a minus side; this is prevented by the above timing.

A current corresponding to a level to which the FD is reset (gate potential of the amplifying transistor Ta) is outputted from Vdd through the horizontal selection transistor Tx and the vertical selection transistors Ty to the I-V converter circuit 501.

In next timing t4, a pulse as a result of an OR of the vertical selection pulse $\phi$Vn and a reading pulse $\phi$prd turns on the reading transistor Tty, whereby output from the PD to the FD is performed. As a result, a current corresponding to a level (gate potential of the amplifying transistor Ta) of the FD varied in potential by electrons resulting from photoelectric conversion is outputted from Vdd through the horizontal selection transistor Tx and the vertical selection transistors Ty to the I-V converter circuit 501.

In next timing t5, the horizontal selection pulse is turned off in the horizontal selection line Hsel (m), whereby the horizontal selection transistor Tx is turned off.

At the time of shutter operation, exactly the same operation is performed also before the horizontal line being read and charge is transferred from the PD to the FD to thereby perform the shutter operation. At this time, no output is produced from the line where the shutter operation is being performed because the vertical selection transistors Ty are off.

A second embodiment of the present invention will next be described.

The second embodiment is obtained by changing the signal wiring structure and contents of pulse signals of the first embodiment.

Figure 5:
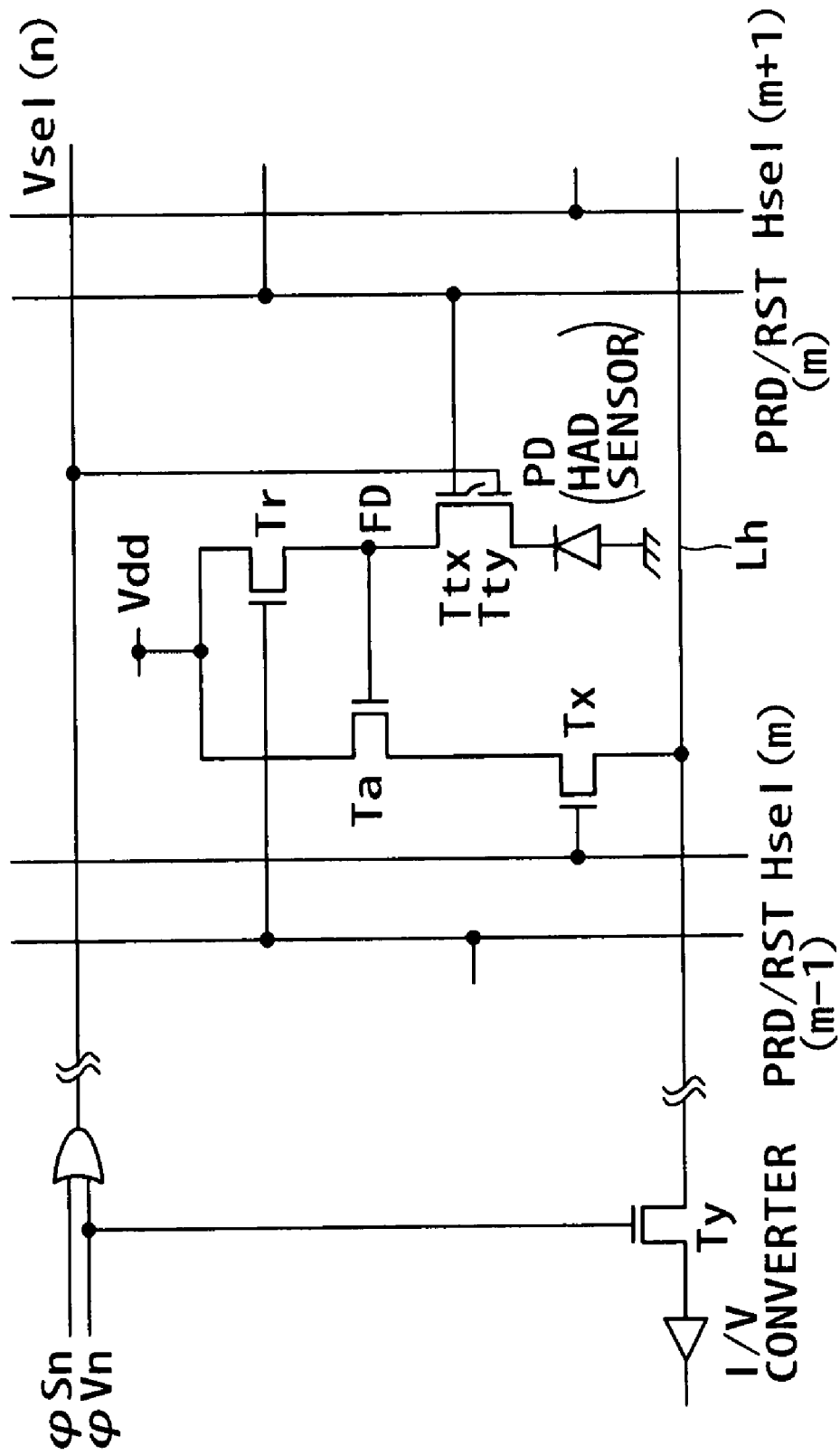
FIG. 5 is a circuit diagram showing a configuration of a unit pixel portion and its periphery in a MOS type solid-state imaging apparatus according to a second embodiment of the present invention.
Figure 6:
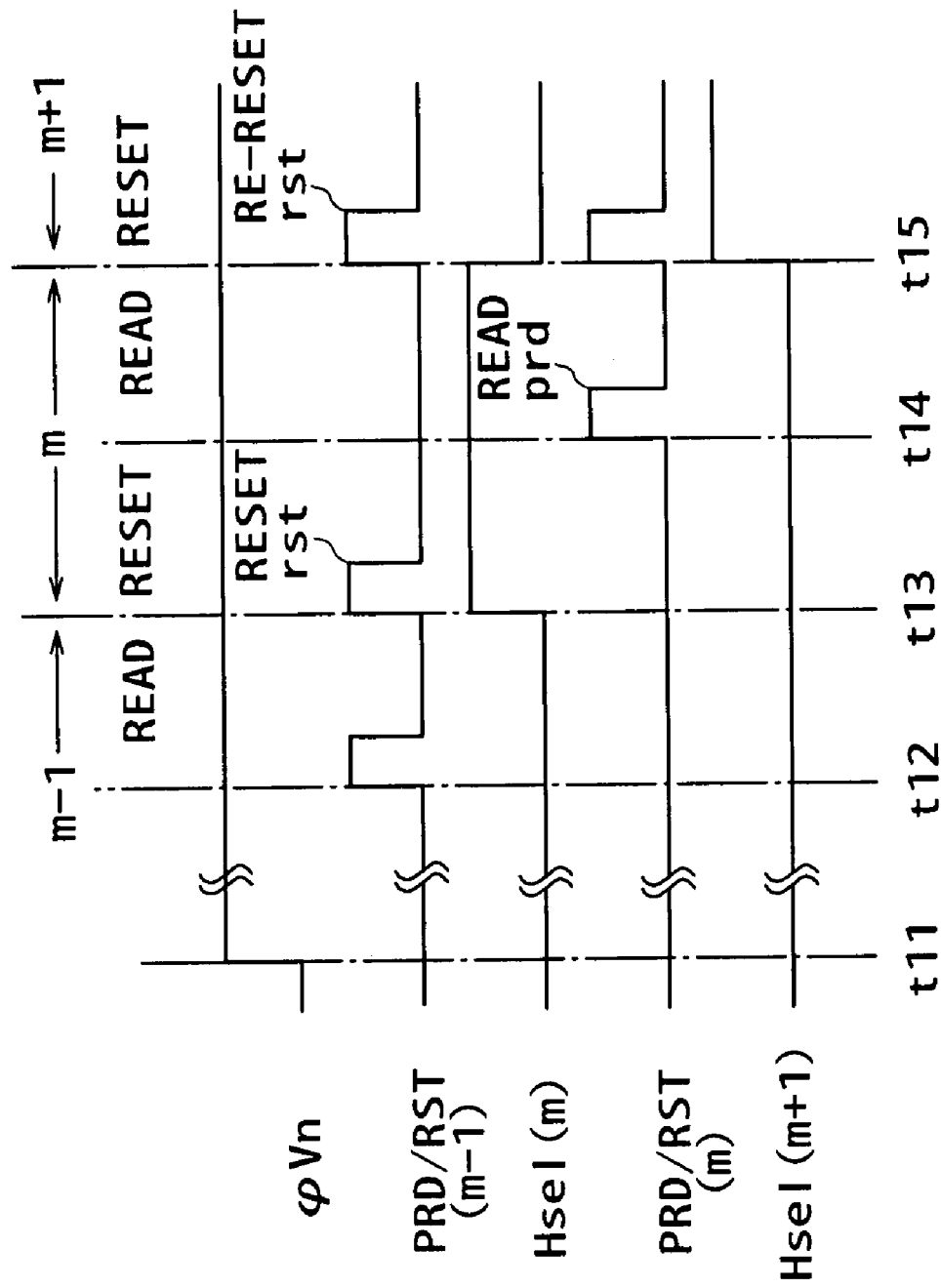
FIG. 6 is a timing chart of operation timing of transistors within the unit pixel portion shown in FIG. 5.

FIG. 5 is a circuit diagram showing a configuration of a unit pixel portion and its periphery in a MOS type solid-state imaging apparatus according to the second embodiment of the present invention. FIG. 6 is a timing chart of operation timing of transistors within the unit pixel portion shown in FIG. 5.

Figure 7:
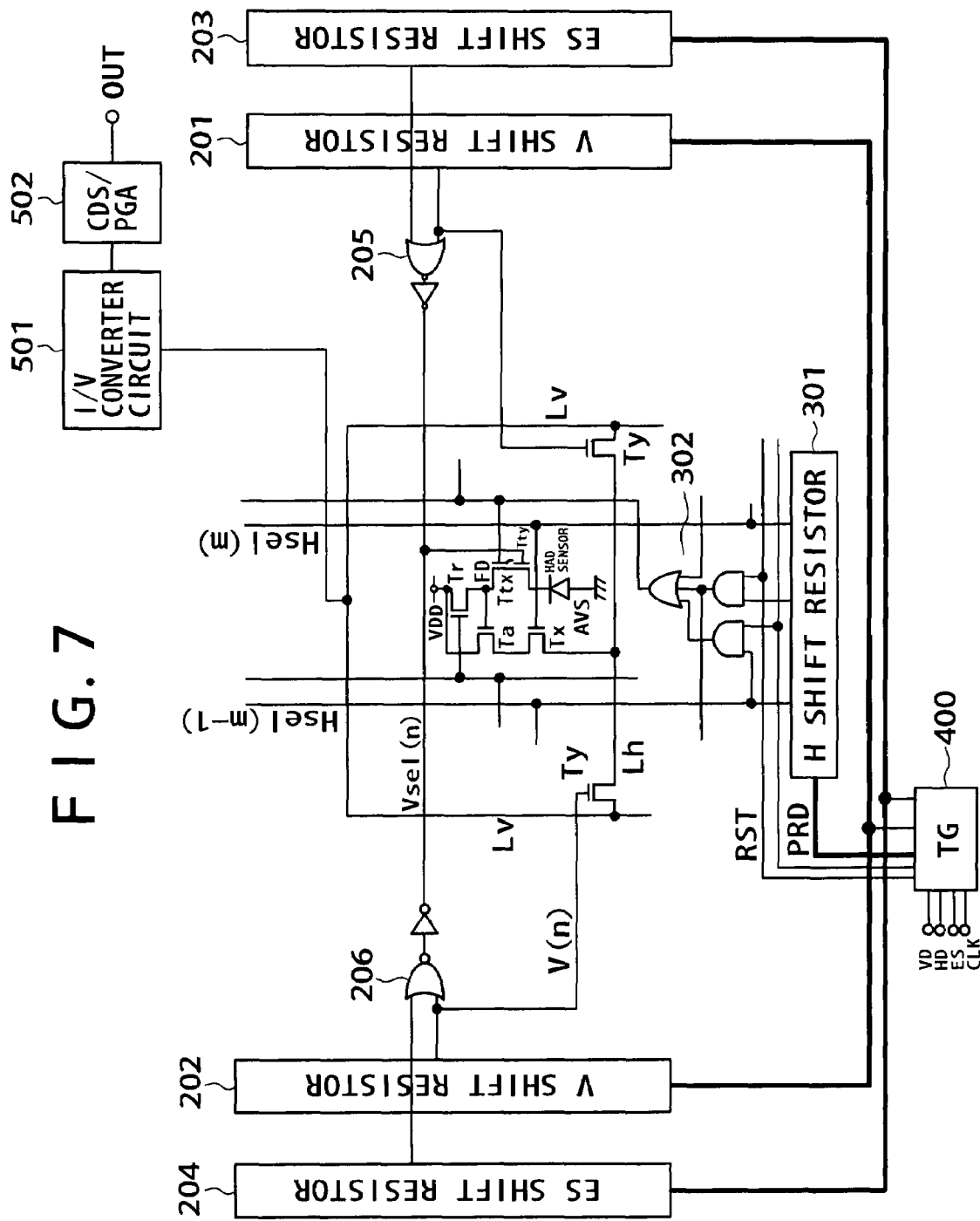
FIG. 7 is a block diagram schematically showing a configuration of the MOS type solid-state imaging apparatus provided with the unit pixel portion shown in FIG. 5.

FIG. 7 is a block diagram schematically showing a configuration of the MOS type solid-state imaging apparatus provided with the unit pixel portion shown in FIG. 5.

Components common to FIGS. 5 to 7 and FIGS. 1 to 3 are identified by the same reference numerals.

In the solid-state imaging apparatus in the second embodiment, a reset/reading line RST/PRD for transmitting a reset pulse for driving a reset transistor Tr and a reading pulse for driving a reading selection transistor Ttx is arranged in correspondence with each column of unit pixels, and a horizontal selection line Hsel transmits only a horizontal selection pulse for a horizontal selection transistor Tx.

Specifically, a horizontal selection line Hsel in an m-th column supplies the horizontal selection pulse to a gate of a horizontal selection transistor Tx in an m-th pixel column, and a reset/reading line RST/PRD in the m-th column supplies the reading pulse to a gate of a reading transistor Tty in the m-th pixel column and supplies the reset pulse to a gate of a reset transistor Tr in an (m+1)th pixel column.

A horizontal scanner is provided with a logical circuit 302 for controlling such a reset/reading line RST/PRD.

Incidentally, a vertical selection line Vsel is the same as in the example shown in FIGS. 1 to 3, and the other configuration is also the same as in the example shown in FIGS. 1 to 3. Therefore, their description will be omitted.

Details of pixel operation in such a configuration will next be described with reference to FIG. 6.

In first timing t11 in FIG. 6, a vertical selection pulse φVn is applied to a vertical selection line Vsel in an n-th row to select the line in the n-th row as a specific line, and turns on the reading transistor Tty and a vertical selection transistor Ty.

In next timing t12, an (m−1)th pixel is read by a reading pulse prd in a reset/reading line RST/PRD (m−1) at the (m−1)th pixel.

In next timing t13, a reset pulse rst in the reset/reading line RST/PRD (m−1) turns on a reset transistor Tr in an m-th pixel to thereby reset an FD.

Also, a horizontal selection pulse in the horizontal selection line Hsel (m) at the m-th pixel turns on the horizontal selection transistor Tx to select a specific pixel in a vertical direction (the m-th pixel in this case).

In next timing t14, a reading pulse prd in the reset/reading line RST/PRD (m) at the m-th pixel turns on a reading selection transistor Ttx, whereby output from a PD to the FD is performed.

As a result, a current proportional to gate voltage of an amplifying transistor Ta is outputted from Vdd through the horizontal selection transistor Tx and vertical selection transistors Ty to an I-V converter circuit 501.

In next timing t15, the horizontal selection pulse in the horizontal selection line Hsel (m) turns off the horizontal selection transistor Tx, and potential on a source side of the amplifying transistor Ta is raised. With this, potential of the FD is also raised (may become Vdd or higher) due to capacitive coupling.

Accordingly, in order to return the raised potential of the FD to Vdd, a reset pulse rst in the reset/reading line RST/PRD (m−1) at the (m−1)th pixel turns on the reset transistor Tr again to thereby re-reset the FD.

Then, a reset pulse in the reset/reading line RST/PRD (m) at the m-th pixel turns on the reset transistor Tr of an (m+1)th pixel to thereby reset an FD. Also, a horizontal selection pulse in a horizontal selection line Hsel (m+1) turns on a horizontal selection transistor Tx to select a specific pixel in the vertical direction (the (m+1)th pixel in this case).

Incidentally, shutter operation is the same as in the foregoing first embodiment, and therefore its description will be omitted.

A third embodiment of the present invention will next be described.

The third embodiment is obtained by changing the signal wiring structure and contents of pulse signals of the first embodiment.

Figure 8:
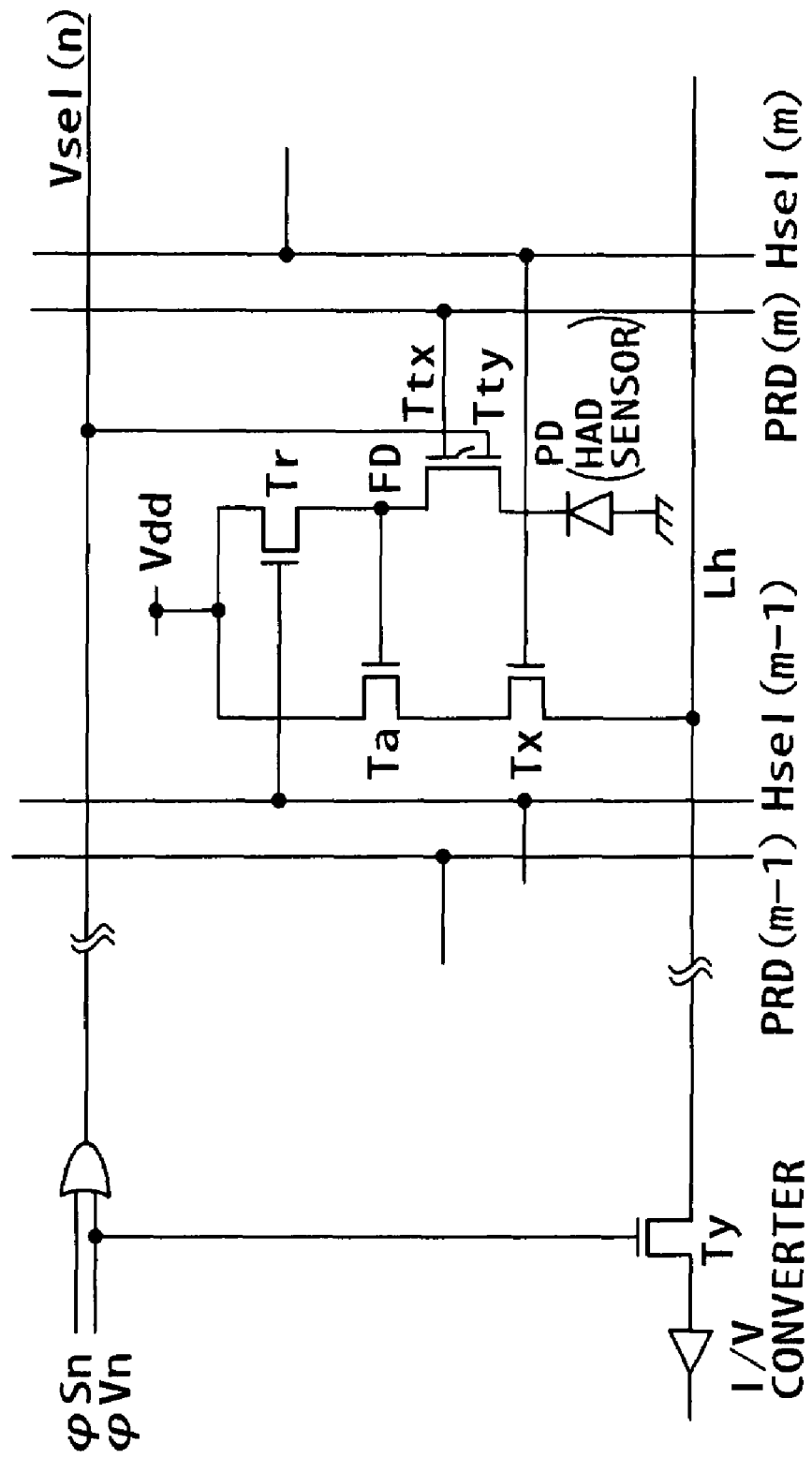
FIG. 8 is a circuit diagram showing a configuration of a unit pixel portion and its periphery in a MOS type solid-state imaging apparatus according to a third embodiment of the present invention.
Figure 9:
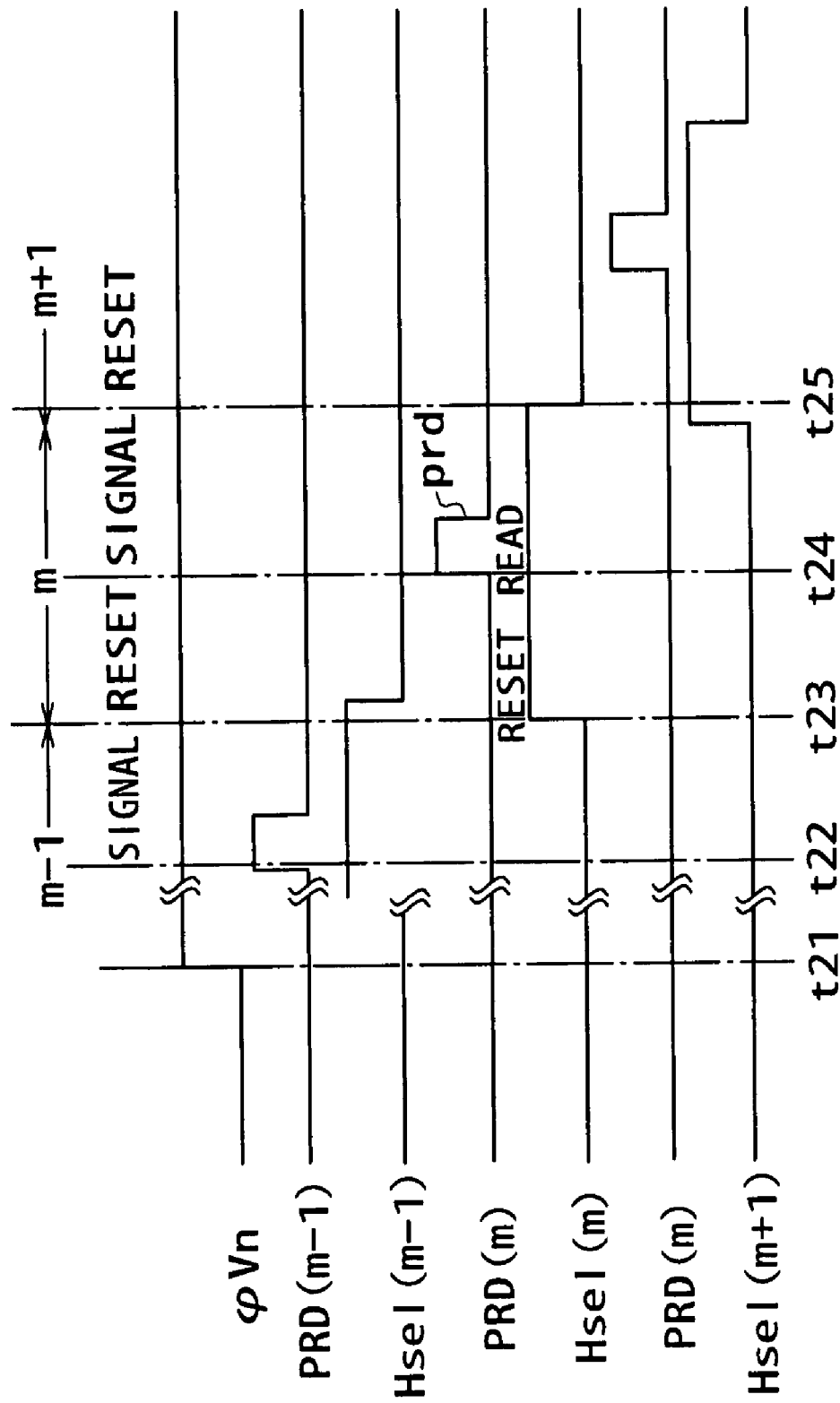
FIG. 9 is a timing chart of operation timing of transistors within the unit pixel portion shown in FIG. 8.

FIG. 8 is a circuit diagram showing a configuration of a unit pixel portion and its periphery in a MOS type solid-state imaging apparatus according to the third embodiment of the present invention. FIG. 9 is a timing chart of operation timing of transistors within the unit pixel portion shown in FIG. 8.

Figure 10:
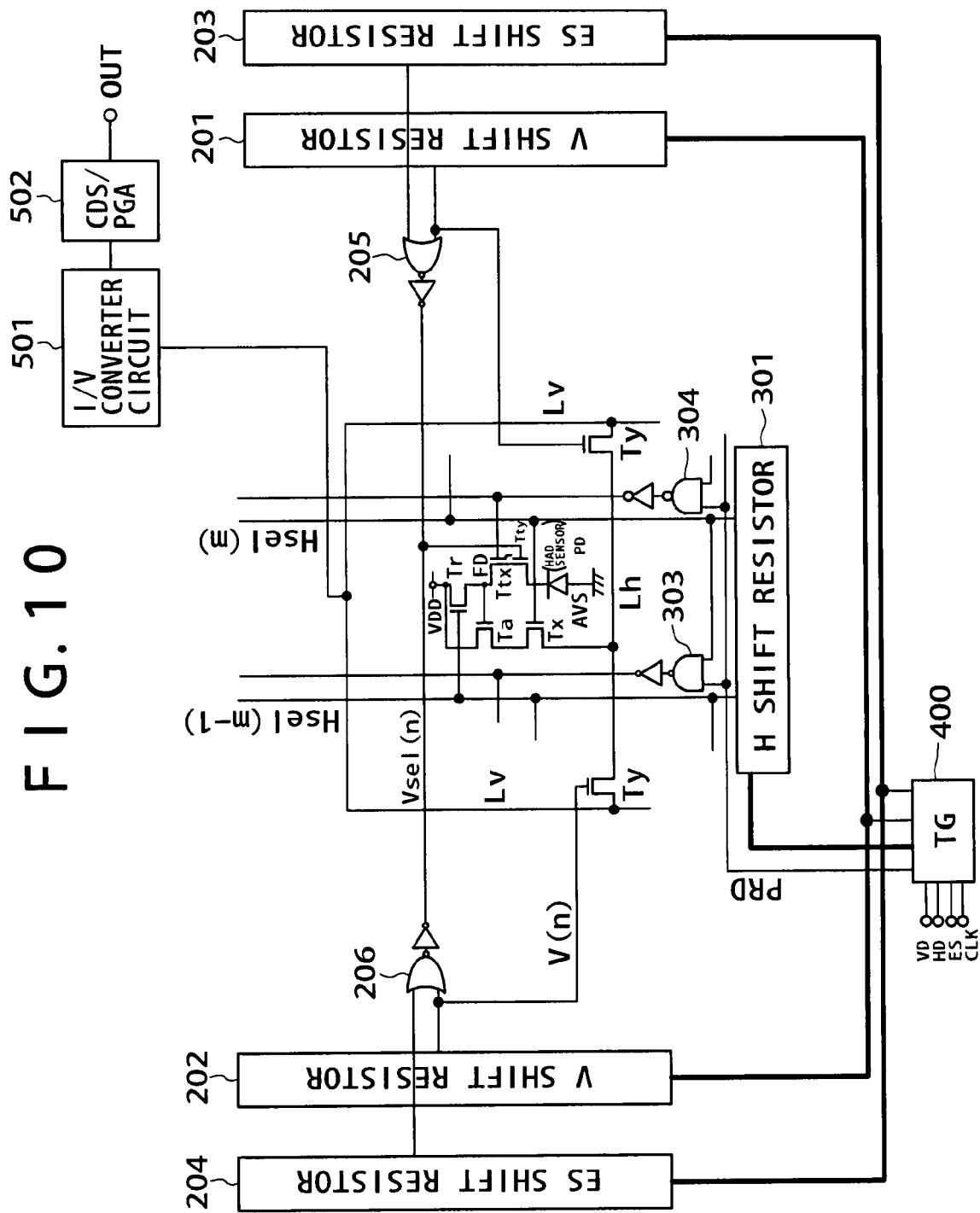
FIG. 10 is a block diagram schematically showing a configuration of the MOS type solid-state imaging apparatus provided with the unit pixel portion shown in FIG. 8.

FIG. 10 is a block diagram schematically showing a configuration of the MOS type solid-state imaging apparatus provided with the unit pixel portion shown in FIG. 8.

Components common to FIGS. 8 to 10 and FIGS. 1 to 3 are identified by the same reference numerals.

In the solid-state imaging apparatus in the third embodiment, a reading line PRD for transmitting a reading pulse for driving a reading selection transistor Ttx is arranged in correspondence with each column of unit pixels, and a horizontal selection line Hsel transmits a reset pulse for driving a reset transistor Tr and a horizontal selection pulse for a horizontal selection transistor Tx.

Specifically, a horizontal selection line Hsel in an m-th column supplies the horizontal selection pulse to a gate of a horizontal selection transistor Tx in an m-th pixel column, and supplies the reset pulse to a gate of a reset transistor Tr in an (m+1)th pixel column. A reading line PRD in the m-th column supplies the reading pulse to a gate of a reading selection transistor Ttx in the m-th pixel column.

A horizontal scanner is provided with logical circuits 303 and 304 for controlling such reading lines PRD.

Incidentally, a vertical selection line Vsel is the same as in the example shown in FIGS. 1 to 3, and the other configuration is also the same as in the example shown in FIGS. 1 to 3. Therefore, their description will be omitted.

Details of pixel operation in such a configuration will next be described with reference to FIG. 9.

In first timing t21 in FIG. 9, a vertical selection pulse φVn is applied to a vertical selection line Vsel in an n-th row to select the line in the n-th row as a specific line, and turns on a vertical selection transistor Ty.

In next timing t22, an (m−1)th pixel is read by a reading pulse in a horizontal selection line Hsel (m−1) at the (m−1)th pixel. At the same time, a reset transistor Tr in an m-th pixel is turned on to reset an FD.

In next timing t23, a horizontal selection pulse in the horizontal selection line Hsel (m) at the m-th pixel turns on the horizontal selection transistor Tx.

By overlapping the pulses in the horizontal selection line Hsel (m−1) and the horizontal selection line Hsel (m), the horizontal selection transistor Tx in the m-th pixel is turned on while the reset transistor Tr in the m-th pixel is turned on to reset the FD, whereby FD potential can be stabilized. That is, if the FD is reset in a state in which the horizontal selection transistor Tx is turned off, when the horizontal selection transistor Tx is turned on next, a variation in source potential of the amplifying transistor Ta shifts the FD potential to a minus side; this is prevented by the above timing.

A current corresponding to a level to which the FD is reset (gate potential of the amplifying transistor Ta) is outputted from Vdd through the horizontal selection transistor Tx and vertical selection transistors Ty to an I-V converter circuit 501.

In next timing t24, a reading pulse prd in the reading line PRD (m) at the m-th pixel turns on the reading selection transistor Ttx, whereby output from a PD to the FD is performed.

As a result, a current corresponding to a level (gate potential of the amplifying transistor Ta) of the FD varied in potential by electrons resulting from photoelectric conversion is outputted from Vdd through the horizontal selection transistor Tx and the vertical selection transistors Ty to the I-V converter circuit 501.

In next timing t25, the horizontal selection pulse in the horizontal selection line Hsel (m) turns off the horizontal selection transistor Tx. At this time, potential of a drain of the horizontal selection transistor Tx is raised, and the potential of the FD is also raised due to capacitive coupling.

Shutter operation is the same as in the foregoing first embodiment, and therefore its description will be omitted.

Of the wiring configurations according to the embodiments described above, one with optimum characteristics can be selected on the basis of actual layout conditions and an actual measurement test on prototypes, for example.

Specifically, it is considered from common knowledge that an increase in the number of wires enlarges wiring space, whereas a decrease in the number of wires reduces the wiring space but causes problems such as an increase in noise and the like. However, these tendencies vary depending on actual layout conditions and other design conditions, and therefore it is difficult to determine the characteristics in a design stage.

It is accordingly effective to make prototypes in view of characteristics actually required and the like, and select an optimum wiring configuration while conducting tests of actual characteristics and the like.

The present invention is not limited to the three wiring examples described above; the present invention is susceptible of various modifications without departing from the spirit thereof.

As described above, in the solid-state imaging apparatus according to the present invention, the gate electrodes of the reading transistor and the reading selection transistor provided in a unit pixel are formed by using two electrode layers different from each other, and gate potential of at least the transistor on the photoelectric converting means side is set to a negative potential.

Thus, the lower region of the gate region of the reading transistor is controlled to a negative potential. It is thereby possible to suppress depletion, reduce leakage current, and hence realize a solid-state imaging apparatus with reduced noise.

Also, in the driving method of a solid-state imaging apparatus according to the present invention, the gate electrodes of the reading transistor and the reading selection transistor are formed by using two electrode layers different from each other, and gate potential of at least the transistor on the photoelectric converting means side is set to a negative potential. Thus, the lower region of the gate electrode of the transistor on the photoelectric converting means side is controlled to a negative potential. It is thereby possible to suppress depletion in the lower region, reduce leakage current, and hence realize a solid-state imaging apparatus with reduced noise.

What is claimed is:

1. A solid-state imaging apparatus comprising:
   a plurality of pixels arranged in a two-dimensional matrix form; and, said pixels, being comprised of:
   a photoelectric converting element providing a signal according to an amount of light received;
   a floating diffusion portion receiving the signal charge accumulated by said photoelectric converting element;
   an amplifying transistor for amplifying a signal level of said floating diffusion portion;
   a reading transistor for transferring the signal accumulated by said photoelectric converting element to the floating diffusion portion; and
   a reading selection transistor for controlling said reading transistor;
   wherein a gate potential of at least one of said reading transistor and said reading selection transistor proximate said photoelectric converting element is set to a negative potential with respect to a well region.

2. A solid-state imaging apparatus as claimed in claim 1, wherein both gate potential of said reading transistor and gate potential of said reading selection transistor are set to a negative potential with respect to the well region.

3. A solid-state imaging apparatus as claimed in claim 1, wherein said reading transistor and said reading selection transistor are connected in series with each other in a channel direction between said photoelectric converting element and the floating diffusion portion, and gate electrodes of said reading transistor and said reading selection transistor are formed such that one of the gate electrode of said reading transistor and said reading selection transistor partly overlaps the other.

4. A solid-state imaging apparatus as claimed in claim 1, further comprising:
   a vertical scanner for scanning said pixels in a vertical direction to select each of said pixels;
   a horizontal scanner for transferring data from said unit pixels in a horizontal direction; and
   an electronic shutter scanner for performing an electronic shutter operation.

5. A solid-state imaging apparatus as claimed in claim 4, further comprising:
   a reset transistor for resetting the signal charge received by said floating diffusion portion; and
   a horizontal selection transistor for sequentially selecting said unit pixels in the horizontal direction.

6. A solid-state imaging apparatus as claimed in claim 5, further comprising:
   a horizontal selection transistor arranged in correspondence with each column of said pixels for transmitting a reset pulse for driving a reset transistor of an adjacent pixel, a horizontal selection pulse for driving said horizontal selection transistor, and a reading pulse for driving said reading selection transistor; and
   a vertical selection line arranged in correspondence with each row of said unit pixels for transmitting a line selection pulse for driving said reading transistor.

7. A solid-state imaging apparatus as claimed in claim 5, further comprising:
   a reset/reading line arranged in correspondence with each column of said unit pixels for transmitting a reset pulse for driving said reset transistor of an adjacent pixel and a reading pulse for driving said reading selection transistor;
   a horizontal selection line arranged in correspondence with each column of said unit pixels for transmitting a horizontal selection pulse for driving said horizontal selection transistor; and
   a vertical selection line arranged in correspondence with each row of said pixels for transmitting a line selection pulse for driving said reading transistor.

8. A solid-state imaging apparatus as claimed in claim 5, further comprising:
   a reading line arranged in correspondence with each column of said pixels for transmitting a reading pulse for driving said reading selection transistor;
   a horizontal selection line arranged in correspondence with each column of said unit pixels for transmitting a reset pulse for driving said reset transistor of an adjacent pixel and a horizontal selection pulse for driving said horizontal selection transistor; and
   a vertical selection line arranged in correspondence with each row of said pixels for transmitting a line selection pulse for driving said reading transistor.

9. A solid-state imaging apparatus as claimed in claim 5, further comprising:
   an I/V converter circuit for converting a current signal read from each unit pixel on a dot-sequential basis by the scanning of said vertical scanner and said horizontal scanner into a voltage signal; and
   a CDS circuit for performing correlated double sampling processing.

10. A driving method of a solid-state imaging apparatus, said solid-state imaging apparatus comprising:
   exposing light upon a plurality of pixels arranged in a two-dimensional matrix form; and,
   photoelectric converting the light and accumulating a signal according to an amount of light received at each pixel;
   transferring the accumulated signal to a floating diffusion portion;
   amplifying a signal level of said floating diffusion portion;
   controlling a reading transistor via a reading selection transistor;
   wherein gate electrodes of said reading transistor and said reading selection transistor are formed by using two electrode layers different from each other, a gate potential of at least the transistor proximate the photoelectric converting element is set to a negative potential, and the gate electrode of said transistor proximate a photoelectric converting element is controlled to a negative potential during at least a part of a non-selection period.

11. A driving method of a solid-state imaging apparatus as claimed in claim 10, further comprising:
   wherein a gate potential of said reading transistor and a gate potential of said reading selection transistor are set to a negative potential during at least the part of the non-selection period.

12. A driving method of a solid-state imaging apparatus as claimed in claim 10,
   scanning said unit pixels in a vertical direction to select each of said pixels;
   and performing electronic shutter operation for each of said pixels.

13. A driving method of a solid-state imaging apparatus as claimed in claim 12, further comprising:
   resetting the signal applied to said floating diffusion portion.

14. A driving method of a solid-state imaging apparatus as claimed in claim 13, further comprising:
   transmitting a reset pulse for driving said reset transistor of an adjacent pixel, a horizontal selection pulse for driving said horizontal selection transistor, and a reading pulse for driving said reading selection transistor by a horizontal selection line arranged in correspondence with each column of said unit pixels.

15. A driving method of a solid-state imaging apparatus as claimed in claim 14, wherein a horizontal selection line in an m-th column supplies the horizontal selection pulse to a gate of a horizontal selection transistor in an m-th pixel column, supplies the reading pulse to a gate of a reading selection transistor in the m-th pixel column, and supplies the reset pulse to a gate of a reset transistor in an (m+1) th pixel column; and a vertical selection line in an n-th row supplies the line selection pulse to a gate of a reading transistor in an n-th pixel row.

16. A driving method of a solid-state imaging apparatus as claimed in claim 13, further comprising:
   transmitting-a reset pulse for driving said reset transistor and a reading pulse for driving said reading selection transistor by a reset/reading line arranged in correspondence with each column of said unit pixels;
   transmitting a horizontal selection pulse for driving said horizontal selection transistor by a horizontal selection line arranged in correspondence with each column of said unit pixels; and
   transmitting a line selection pulse for driving said reading transistor by a vertical selection line arranged in correspondence with each row of said unit pixels.

17. A driving method of a solid-state imaging apparatus as claimed in claim 16,
   wherein a horizontal selection line in an m-th column supplies the horizontal selection pulse to a gate of a horizontal selection transistor in an m-th pixel column;
   a reset/reading line in the m-th column supplies the reading pulse to a gate of a reading selection transistor in the m-th pixel column and supplies the reset pulse to a gate of a reset transistor in an (m+1)th pixel column; and
   a vertical-selection line in an n-throw supplies the line selection pulse to a gate of a reading transistor in an n-th pixel row.

18. A driving method of a solid-state imaging apparatus as claimed in claim 13, further comprising the steps of:
   transmitting a reading pulse for driving said reading selection transistor by a reading line arranged in correspondence with each column of said unit pixels;
   transmitting a reset pulse for driving said reset transistor and a horizontal selection pulse for driving said horizontal selection transistor by a horizontal selection line arranged in correspondence with each column of said unit pixels; and
   transmitting a line selection pulse for driving said reading transistor by a vertical selection line arranged in correspondence with each row of said unit pixels.

19. A driving method of a solid-state imaging apparatus as claimed in claim 18,
   wherein a horizontal selection line in an m-th column supplies the horizontal selection pulse to a gate of a horizontal selection transistor in an m-th pixel column, and supplies the reset pulse to a gate of a reset transistor in an (m+1) th pixel column;
   a reading line in the m-th column supplies the reading pulse to a gate of a reading selection transistor in the m-th pixel column; and
   a vertical selection line in an n-th row supplies the line selection pulse to a gate of a reading transistor in an n-th pixel row.

* * * * *